United States Patent
Courant

(10) Patent No.: US 6,305,074 B1
(45) Date of Patent: *Oct. 23, 2001

(54) SUPPORT FOR INTEGRATED CIRCUIT AND PROCESS FOR MOUNTING AN INTEGRATED CIRCUIT ON A SUPPORT

(75) Inventor: Patrick Courant, Viroflay (FR)

(73) Assignee: Bull, S.A., Louveciennes (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/000,363

(22) PCT Filed: Jun. 11, 1997

(86) PCT No.: PCT/FR97/01031

§ 371 Date: Jan. 28, 1998

§ 102(e) Date: Jan. 28, 1998

(87) PCT Pub. No.: WO97/48130

PCT Pub. Date: Dec. 18, 1997

(30) Foreign Application Priority Data

Jun. 13, 1996 (FR) .................................................. 96 07372

(51) Int. Cl.[7] .................................................... H01R 43/00
(52) U.S. Cl. ................................ 29/827; 29/830; 29/832; 29/841
(58) Field of Search ............................. 29/827, 840, 843, 29/832, 834, 841, 576, 830, 831

(56) References Cited

U.S. PATENT DOCUMENTS

| 4,209,355 | * | 6/1980 | Burns | 156/630 |
|---|---|---|---|---|
| 4,842,662 | | 6/1989 | Jacobi . | |
| 5,162,896 | * | 11/1992 | Takubo et al. | 257/664 |
| 5,397,921 | * | 3/1995 | Karnezos | 257/779 |
| 5,409,865 | * | 4/1995 | Karnezos | 29/827 |
| 5,474,957 | * | 12/1995 | Urushima | 29/827 |
| 5,521,425 | * | 5/1996 | Deeney | 257/666 |
| 5,612,259 | * | 3/1997 | Okumoto et al. | 437/209 |
| 5,728,599 | * | 3/1998 | Rostoker et al. | 505/330 |
| 5,807,767 | * | 9/1998 | Stroupe | 438/123 |
| 5,816,472 | * | 10/1998 | Linn | 228/1.1 X |
| 5,826,328 | * | 10/1998 | Brady et al. | 29/827 |
| 5,945,729 | * | 8/1999 | Stroupe | 257/666 |

FOREIGN PATENT DOCUMENTS

| 2386138 | 10/1978 | (FR) . |
|---|---|---|
| 58134454 | of 1983 | (JP) . |

OTHER PUBLICATIONS

Patent Abstracts of Japan, vol. 012, No. 009 (E–572), Jan. 12, 1988 & JP 62 169353 A (NEC Corp), Jul. 25, 1987, see abstract.

Patent Abstracts of Japan, vol. 007, No. 247 (E–208), Nov. 2, 1983, & JP 58 134454 A (Sharp KK), Aug. 10, 1983, see abstract.

IBM Technical Disclosure Bulletin, vol. 37, No. 7, Jul. 1, 1994, p. 319 XP000455530 "Inner Lead Bond Lead Reform".

* cited by examiner

Primary Examiner—Jessica J. Harrison
Assistant Examiner—Binh-An D. Nguyen
(74) Attorney, Agent, or Firm—Miles & Stockbridge P.C.; Edward J. Kondracki

(57) ABSTRACT

The process for mounting an integrated circuit (11) on a support (10) comprising a structure (13) of conductors (14) comprises connecting the conductors to respective terminals (12) of the integrated circuit without interposing a part of the support for insulating the conductors of the integrated circuit as in the standard TAB technology. The connection can be made directly by thermocompression or ultrasound, or indirectly through ball bonds. It is only after the connection that the insulation between the conductors and the integrated circuit is applied. The insulating substrate of the TAB support (10) can be attached to the conductors outside the integrated circuit, before or after the connection of the conductors.

6 Claims, 2 Drawing Sheets

SUPPORT FOR INTEGRATED CIRCUIT AND PROCESS FOR MOUNTING AN INTEGRATED CIRCUIT ON A SUPPORT

FIELD OF THE INVENTION

The invention relates to a process for mounting an integrated circuit on a support and to the resulting support. It applies more particularly to the tape mounting technology, commonly called TAB (Tape-Automated Bonding) technology.

DESCRIPTION OF RELATED ART

Integrated circuits are actually thin, substantially quadrangular slices of semiconductor material, the largest of which has about 15 mm per side. They are provided with a large number of input-output terminals, on the order of 500. In TAB technology, each integrated circuit is mounted on a support constituted by an insulating substrate which carries a conductive metallic structure, generally called a spider. The input-output terminals of the integrated circuit are attached, by an operation called ILB (Inner Lead Bonding), to the respective ends of conductors of the spider. The substrate can exist in various forms. It can, for example, take the form of a flexible strip of the motion picture film type provided with lateral perforations for moving and positioning it, which carries integrated circuits disposed along its length. Another common form is comprised of a frame carrying one or more integrated circuits.

A first type of standard TAB support is made of a spider bonded to a substrate. This support is comprised of three layers: spider—adhesive—substrate. Ordinarily, the spider is a sheet of copper having a thickness of about 17 to 70 $\mu$m, the adhesive is made of acrylic or epoxy, spread to a thickness of about 25 $\mu$m, and the substrate is made of an organic material that is flexible and electrically insulating, whose minimum thickness is about 50 $\mu$m and usually on the order of 100 $\mu$m. The fabrication of the support is comprised, in standard fashion, of bonding a uniform sheet of copper to the substrate, and of etching the sheet of copper to form the spider. According to a first embodiment, the substrate is preformed so as to have the desired configuration of the openings it comprises. The preforming is done by mechanical cutting, such as punching. A second embodiment is comprised of cutting the substrate after the formation of the spider. This support and the mounting of the integrated circuits on this support have several drawbacks.

The ILB operation takes place through openings in the substrate and the adhesive. According to a first embodiment, the openings are small plated-through holes disposed underneath the ends of the conductors. The standard attachment of each end to the corresponding terminal of the integrated circuit is achieved by means of a ball bond which must have a diameter substantially greater than the height of the hole, which is a minimum of about 75 $\mu$m. These large balls can only be soldered to large terminals, and require the punching of large plated-through holes, on the order of 600 to 800$\mu$m, which conflicts with the desired density of the terminals of the integrated circuit and their connection. However, the formation of large plated-through holes can be achieved by mechanical cutting of the substrate before bonding it to the copper sheet. This cutting offers the advantage of being inexpensive and well suited to mass production, but it has the serious drawback of being inapplicable to the high densities that are currently available.

Several solutions have been proposed for adapting an integrated circuit support to high densities. One solution is comprised of piercing the substrate after the formation of the spider, either chemically or using precision cutting means such as a laser. However, chemical cutting requires numerous additional processing operations, such as the deposit of a photosensitive layer on the substrate, the sensitization and etching of this layer so as to form a mask having the desired configuration, the etching of the substrate, the removal of the adhesive, and finally, the removal of the mask. These operations add considerably to the cost of the support. The same is true for the use of laser. In practice, it has proven impossible to produce preliminary designs or prototypes on a small scale at costs that are not prohibitive. Moreover, a cutting operation of this type leaves residues which can interact with the solder during the ILB operation, thus forming a connection that is of poor quality or is not very reliable.

Another solution resides in a second type of standard support, called a two-layer support: spider—substrate. For the fabrication of this support, a thin uniform layer of copper is deposited under vacuum onto one side of a thin substrate of insulating material. Ordinarily, a polyimide substrate about 20 $\mu$m thick is used, and a very thin layer of copper is deposited on it under vacuum, generally through the medium of a priming layer made of chromium for example, and the copper is selectively grown electrochemically so as to form the spider. The thin layer of copper used as a base for the growth remaining outside the desired configuration of the spider is removed. The substrate is then etched chemically or by precision cutting means such as a laser, as in the preceding embodiment. In particular, it will be noted that the use of polyimide involves the etching of the substrate by oxygen plasma. The oxygen plasma does not attack the organic material, that is, the photosensitive material and the polyimide, but it has the drawback of having a relatively long penetration time, on the order of one micrometer per minute. It is understood that this process cannot be applied industrially to a thick substrate. The resulting support costs about three times as much as a standard three-layer support in which the substrate is perforated mechanically. Moreover, the thinness of the substrate can make it too flexible when it is large, more than 70 mm for example, thus rendering it difficult to use. But the resulting support has the advantage of being thin and of being able to use small ball bonds to carry out the ILB operation.

Yet another solution has been presented in the Applicant's patent EP-A-0356300. The support is mixed, in that it is essentially the standard three-layer type with a preformed substrate and in that the ends of the conductors carry a thin frame that is perforated for using small ball bonds during the ILB operation. Thus, it has the advantages of both of the above-mentioned standard types. The fabrication of the thin frame can be costly and its mounting is a delicate operation.

Another problem involves avoiding the use of ball bonds in the ILB operation. One solution was disclosed in the IBM document Technical Disclosure Bulletin, Vol. 25, No. 4, September 1982, "No-bump beam tape." In this solution, the gold-plated copper conductors are supported on the edge of the integrated circuit by the insulating photodefinable polyimide substrate of the support, and a soldering tool presses down on their ends in order to bond them directly to the terminals of the integrated circuit by thermocompression. Each of these terminals is the bottom, ordinarily made of aluminum, of a plated-through hole in the passivation layer which covers and protects the corresponding surface of the integrated circuit. The height of a plated-through hole is on the order of one micrometer. Taking into account the small width of a plated-through hole and its proximity to the edge of the integrated circuit, it requires a thin insulating substrate in order to avoid excessive bending of the end of the conductor in order to lower it to the bottom of the plated-through hole. This explains why the support used is the second standard type mentioned above. Otherwise, it is necessary to bend the ends of the conductors before soldering them to the terminals of the integrated circuit. This bending has the drawback of adding a delicate operation and of using a relatively expensive bending device.

The same problems and drawbacks arise when using the process described in the patent U.S. Pat. No. 4,917,286. The process for mounting an integrated circuit on a support is very similar to that described above and is comprised of placing the substrate on the passivation layer, of lining up the holes of the substrate with the plated-through holes, and of bending the conductors in order to bond them directly to the terminals of the integrated circuit by ultrasound.

SUMMARY OF THE INVENTION

The object of the invention is to render the ILB operation independent of the type of substrate.

Another object of the invention is to adapt the support to the direct ILB operation, that is, the one that does not use ball bonds.

The subject of the invention is a process for mounting an integrated circuit on a support comprising a structure of conductors provided for connecting the input-output terminals of the integrated circuit, characterized in that it is comprised of connecting the conductors to the respective terminals of the integrated circuit without interposing a part of the support for insulating the conductors from the integrated circuit.

A corollary subject of the invention is a support for at least one integrated circuit, comprising a structure of conductors connected to the respective input-output terminals of the integrated circuit, characterized in that the conductors are connected to these input-output terminals without an interposed part of the support for insulating the conductors from the integrated circuit.

BRIEF DESCRIPTION OF THE DRAWINGS

The characteristics and advantages of the invention will emerge from the following description, given as an example and made in reference to the appended drawings.

DETAILED DESCRIPTION OF EXEMPLARY EMBODIMENTS OF THE INVENTION

Figure 1:
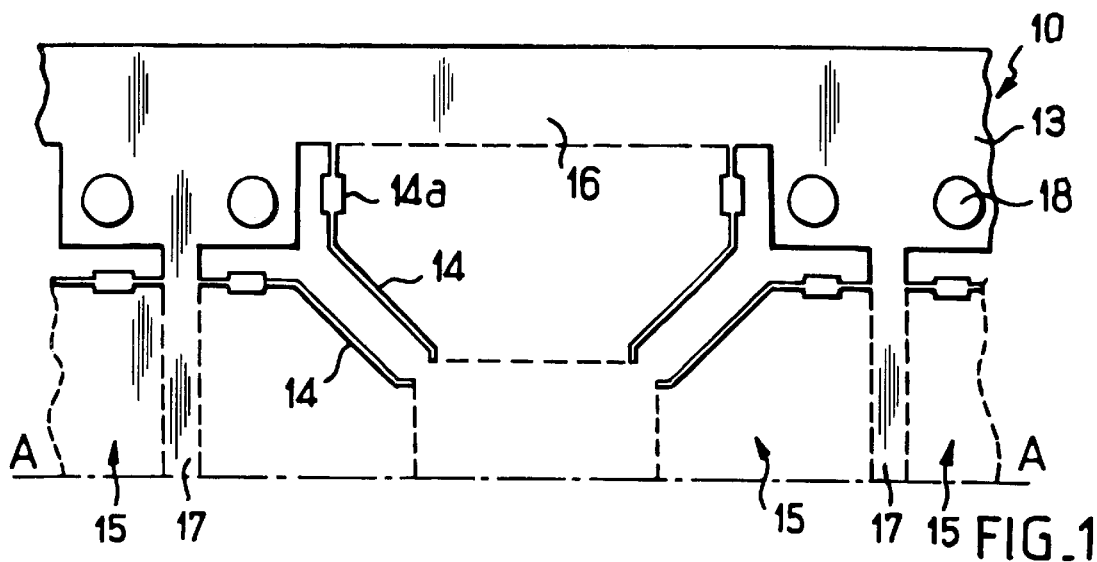
FIG. 1 is a partial plan view of the support used in a first step of the process according to the invention for mounting at least one integrated circuit on the support.
Figure 2:
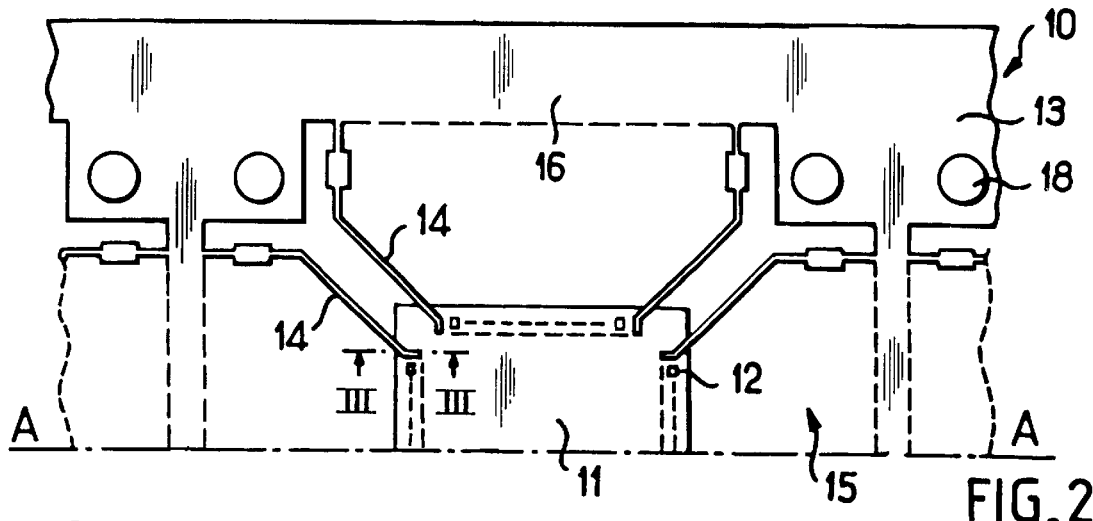
FIG. 2 is a view similar to that in FIG. 1 and illustrates a second step of the process according to the invention.

FIGS. 1 and 2 illustrate two steps of a preferred example of a process according to the invention for mounting at least one integrated circuit on a support. In the example chosen, and as represented in FIGS. 1 and 2, a support 10 in the form of a flexible strip is used for mounting a plurality of integrated circuits 11 having peripheral input-output terminals 12. FIGS. 1 and 2 are partial plan views of the support 10 having a longitudinal axis of symmetry A—A. For this reason, only half of the support delimited by the axis A—A is illustrated. Generally, the dimensions and proportions which appear in the appended figures are not those of an actual support for reasons of clarity in the drawings. The appended drawings are schematic and are provided only as an indication for one skilled in the art, who will know how to correspond them to reality without any problem and without ambiguity.

The process according to the invention begins with the step represented in FIG. 1. This step is comprised of using a structure 13 of conductors 14. The structure 13 illustrated is a strip which constitutes the support 10 and will be called a spider. Its fabrication can be standard, consisting of etching a flat and uniform strip of copper so as to form the conductors 14 of the spider. The conductors 14 are disposed in sectors 15 which run one after another along the length of the strip. In each sector, the conductors 14 have free ends positioned so as to correspond with the terminals 12 of an integrated circuit 11, as indicated in FIG. 2, and have opposite ends attached to at least one of the two continuous edges 16 of the spider. The edges 16 illustrated carry the conductors 14, which run substantially in the direction perpendicular to the edges. The edges 16 are connected to one another by connecting bars 17 which transversely delimit the sectors 15. The connecting bars serve to support the conductors running substantially in the longitudinal direction of the spider. For the clarity of the drawings, only the two conductors 14 disposed in the two end positions of the four groups of conductors are illustrated, the presence of the other conductors being suggested by broken lines between the respective ends of these conductors. The conductors 14 also have test regions 14a in the vicinity of the edges 16 and the connecting bars 17 to which the conductors are attached. The spider 13 also has means 18 for its positioning. The means illustrated are round holes 18 located in the four corners of each sector 15 and disposed in copper extensions at the level of the junction of the edges 16 with the connecting bars 17. In the example illustrated, the holes 18 are also used for moving the spider. However, moving means could be added, such as for example regularly spaced holes (not illustrated) along each of the edges, as in a strip of motion picture film. In this case, these holes could also be used for positioning. In the example chosen, the spider 13 is a continuous copper structure, uniformly gilded by electroplating.

FIG. 2 illustrates the second step of the process according to the invention. The free ends of the conductors 14 of each frame 15 are attached by an ILB operation to the respective terminals 12 of an integrated circuit. The ILB operation illustrated is the direct type, done for example by thermocompression or by ultrasound.

Figure 3:
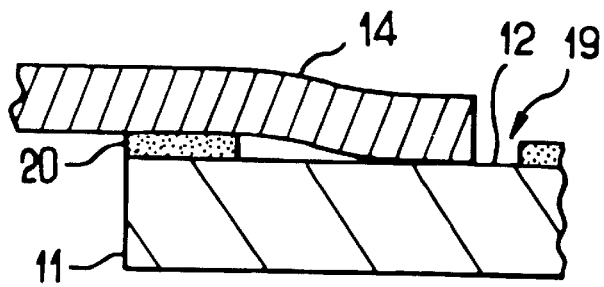
FIG. 3 is a partial cutaway view along the line III—III at the level of a terminal of the integrated circuit represented in FIG. 2.

FIG. 3 is a partial cutaway view in greater detail of a conductor 14 connected to a terminal 12 of the integrated circuit 11. The terminal 12 is formed by the bottom of a plated-through hole 19 made in the passivation layer 20 covering the active surface of the integrated circuit.

Ordinarily, the height of a plated-through hole 19 is on the order of one micrometer, while a conductor 14 has a thickness of 17 to 70 $\mu$m. Under these conditions, the ends of the conductors 14 are practically not bent in order to lead them to the bottom of the respective plated-through holes 19. The ILB operation therefore poses no problem. Moreover, in this case it is done in the total absence of an insulating substrate.

Figure 4A:
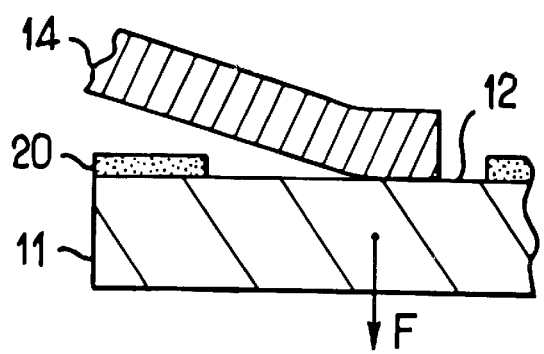
FIGS. 4A and 4B are views similar to that in FIG. 3 and illustrate a third step of the process according to the invention.
Figure 4B:
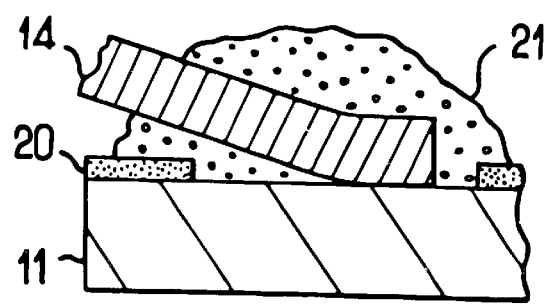

FIGS. 4A and 4B are views similar to the one in FIG. 3 and illustrate the third step of the process. This step is comprised of electrically insulating the conductors 14 from the integrated circuit 11, that is, of preventing a conductor from coming into contact with the corresponding surface of the integrated circuit. In the example chosen, a force F perpendicular to the plane of the integrated circuit is exerted on it in order to separate the conductors 14 from the passivation layer 20, as indicated in FIG. 4A. As seen in FIG. 4B, an insulating resin 21 is deposited and once it hardens, it keeps the conductors 14 separate without the presence of the force F. The resin 21 can be a drop deposited at the level of each conductor, or a continuous flow along a group or all of the conductors, or it can completely or partially cover the active surface of the integrated circuit.

Figure 5:
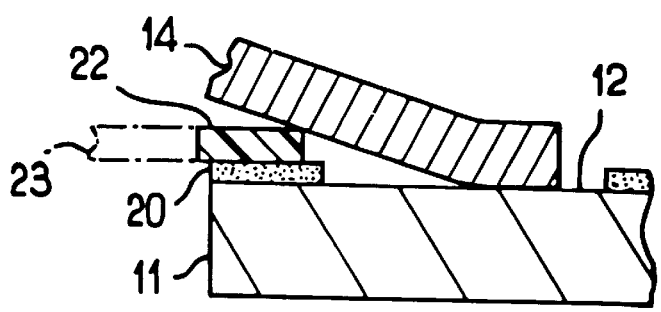
FIG. 5 is a view similar to that in FIG. 3 and illustrates a variant of embodiment which can be substituted for the one illustrated in FIG. 4B.

FIG. 5 is a view similar to the one in FIG. 3 and illustrates an exemplary embodiment which can be substituted for the one in FIG. 4B. Instead of using a resin, the separation between the conductors and the passivation layer is maintained by inserting means which form a spacer 22. These means can be made from a strip of insulating material deposited underneath each group of conductors disposed on one side of the integrated circuit. Each strip can also be mounted on the passivation layer as illustrated, or under the conductors 14.

Figure 6:
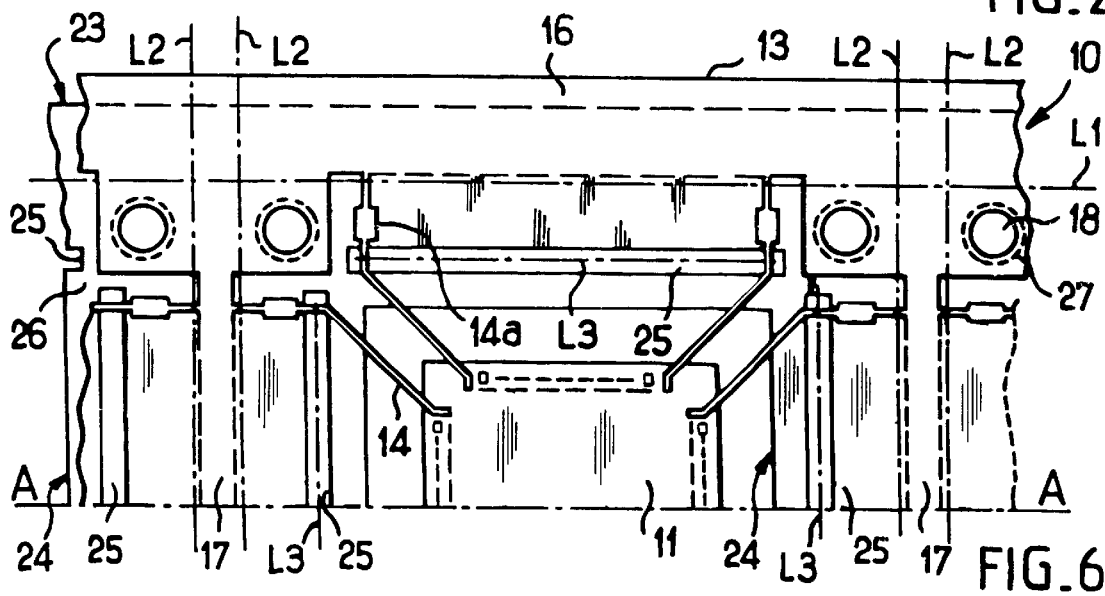
FIG. 6 is a view similar to that in FIG. 2 and illustrates a fourth step of the process according to the invention, as well as a possible utilization of the resulting support.

FIG. 6 is a view similar to the one in FIGS. 1 and 2. In FIG. 6, an insulating substrate 23 is attached to the spider 13. The substrate can be solid or comprised of several pieces, and may or may not be pierced. The pieces can also be simultaneously or successively positioned and attached to the spider. The substrate 23 illustrated is a solid strip, coaxial to the axis A—A, whose edges partially cover the edges 16 of the spider 13. It is composed of successive solid frames 24 attached to the conductors 14 in the respective sectors 15. Each frame 24 illustrated is rectangular, and its four inner edges are disposed parallel to and outside the four respective sides of the integrated circuit 11. It is perforated with four openings 25, which run along each internal side of the frame and are separated from one another by arms 26 disposed at the four respective corners of the frame. Moreover, four holes 27 are disposed coaxial to the positioning holes 18 and have a larger diameter than the holes 18. Since the openings and the holes have large dimensions, the substrate can be perforated mechanically at the lowest cost.

The substrate 23 illustrated is attached after the connection of the conductors 14 to the terminals 12 of the integrated circuit 11. Since each frame 24 is separated from the area provided for the integrated circuit, it can no longer interfere with the direct connection. It follows that the substrate 23 could be positioned before the connection step. In this case, FIG. 6 would be inserted between FIGS. 1 and 2.

On the other hand, the steps represented in FIGS. 5 and 6 could be combined. In a first example of such a combination, the installation of the spacers 22 could take place at the same time as that of the substrate 23. In a second example, the four spacers 22 are integral parts of the four inner sides of the corresponding frame 24, as represented schematically by a dot-and-dash line in FIG. 5. In this case, if the insertion of spacers 22 between the conductors 14 and the integrated circuit 11 is difficult, one solution could be comprised of forming each frame 24 of four separate quadrants, each of which corresponds to one side of the integrated circuit.

FIG. 6 also illustrates, with broken lines, the subsequent usage of the support 10. The two lines Li parallel to the edges 16 of the spider 13 illustrate two cutting lines of the support 10. A cutting of the conductors 14 mounted on the edges 16 takes place between the edges 16 and the test regions 14a of the conductors 14. Likewise, the conductors 14 attached to the connecting bars 17 are cut along the lines L2 parallel to the connecting bars 17 and located between the test regions 14a and the bars. Thus, these cutting lines separate the sectors 15 from one another. Moreover, they insulate the conductors 14 from one another and make it possible to perform the electrical testing of the integrated circuit 11.

Also appearing in FIG. 6 are three cutting lines L3 of the conductors 14 along the axis of the openings 25 in each frame. These lines illustrate the cutting performed in order to detach the integrated circuit 11 from the corresponding sector 15 and to mount the integrated circuit on a connection board such as a printed circuit board. This cutting is commonly called an OLB (Output Lead Bonding) operation.

Figure 7:
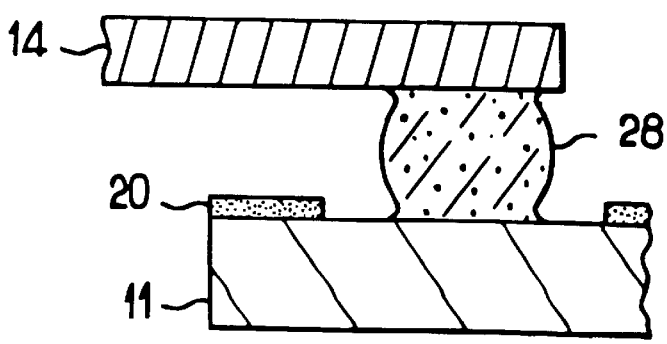
FIG. 7 is a view similar to that in FIG. 3 and illustrates one possible variant of the third step of the process according to the invention.

FIG. 7 is a view similar to the one in FIG. 3 and illustrates a variant for connecting the conductors 14 to the terminals 12 of the integrated circuit 11. The ILB operation is indirect, in this case carried out in the standard way using ball bonds 28. These balls are pre-installed in the plated-through holes. It could also be carried out by means of elements similar to ball bonds and used to raise the input-output terminals 12 of the integrated circuit 11. The connection is made without an interposed part of the support which insulates the conductors from the integrated circuit and which is traditionally used in TAB technology. A spacer 22 like the one illustrated in FIG. 5 can easily be inserted later.

Generally, what is clear from the preceding description is that the subject of the invention is a process for mounting an integrated circuit 11 on a support 10 comprising a structure 13 of conductors 14 provided for connecting the input-output terminals 12 of the integrated circuit, which process consists of connecting the conductors to the respective terminals of the integrated circuit without interposing a part of the support for insulating the conductors from the integrated circuit. The insulation by an insulating material between the conductors and the integrated circuit is carried out after the connection of the conductors.

This process offers two major advantages. The first advantage is that it eliminates the constraints previously imposed by the presence of a substrate. In the preferred embodiment of the invention, as illustrated in FIGS. 1 through 6, the substrate is only attached after the connection and insulation of the conductors. However, since the substrate is only used to support the conductors outside the integrated circuit, it has been shown that it can be added before the insulation of the conductors or even at the moment of the insulation. The second advantage is that it makes it possible to perform direct ILB operations, without ball bonds and practically without bending the conductors. However, it has been shown that indirect ILB operations are also possible. The implementation of the process is therefore simple, provides great flexibility in adapting the process to all cases, and can be achieved at a low cost.

The insulation illustrated in FIGS. 4A and 4B is comprised of separating the conductors from the integrated circuit and keeping them separated. The separation is obtained by the action of a force F and is maintained by the deposit and solidification of an electrically insulating material, while in FIG. 5 it is maintained by the insertion of electrically insulating means which form a spacer between the conductors and the integrated circuit. In this case, it has been shown that if these means are integral parts of an insulating substrate, the insulation can take place at the same time as the mounting of the substrate. In other words, the process can then be comprised of simply attaching the substrate to the conductors in order to maintain the insulation. This method of insulation is not the only one that is applicable. For example, the insulation could be carried out by means of a preliminary bending of the conductors, preferably maintained by the application of a resin or an insulating strip, as illustrated in FIGS. 4B and 5. In this case, the insulation could be done simply, without having to separate the conductors ahead of time. It may therefore be seen that if the insulating means 22 are integral parts of an insulating substrate 23, the insulation can take place at the same time as the attachment of the substrate 23 to the conductors 14, without necessarily having to separate the conductors after their connection.

In the example illustrated, the structure of conductors is provided with positioning means 18 and the process retains these positioning means after the attachment of the substrate. In the prior art, the means for positioning the support are formed in the insulating substrate. Since this is ordinarily made of a plastic material, the holes can have difficulty providing a precise and reliable positioning. On the contrary, the holes 18 for positioning the support of the invention are formed in the metal structure constituting the spider 13. The holes 18 easily allow a precise and reliable positioning of the support 10. In the example illustrated, the positioning holes 18 are smaller than the holes 27 of the substrate and thus retain their function of precise and reliable positioning after the cutting of the support.

The result of the implementation of the process is a support for at least one integrated circuit, comprising a structure of conductors connected to the respective input-output terminals of the integrated circuit without an interposed part of the support which insulates the conductors from the integrated circuit. The direct connection requires no cambering and practically no bending of the conductors. The structure is sufficient on its own, and does not require a substrate.

In the example illustrated, the structure is mounted on a substrate external to the integrated circuit. However, it can extend into the area of the integrated circuit in the case where the substrate also provides the insulation, as indicated in reference to FIG. 5. In FIG. 4B, the insulating substance 22 is not a part of the substrate or of the support and has been added.

While a preferred embodiment of the invention has been illustrated and described, it will be apparent to those of ordinary skill in the art that various changes and modifications may be made without deviating from the inventive concept and spirit of the invention as set forth above, and it is intended by the appended claims to define all variations which come within the full scope and true spirit of the invention.

What is claimed is:

1. A process for fitting an integrated circuit (11) with a structure (13) of conductors (14) provided for connecting input-output terminals (12) of the integrated circuit, each said conductors (14) including a respective end portion and a corresponding body portion, said process comprising the steps of:

connecting a free end portion of each conductor to a respective terminal of the integrated circuit without interposing an insulator between a corresponding body portion of said each conductor and the integrated circuit during said connecting step;

separating the body portion of said each conductor from the integrated circuit by applying a force (F) to the face of the integrated circuit, the force (F) being perpendicular to the face, without interfering with the connection of the free end portion of said conductor; and maintaining a separation of said body portion from said integrated circuit by adding an insulator between said body portion of said each conductor and the face of the integrated circuit.

2. The process according to claim 1, wherein the connection of the conductors to the terminals of the integrated circuit is direct.

3. The process according to claim 1, wherein the separation is maintained by a deposit and solidification of an electrically insulating material (21).

4. The process according to claim 1,wherein the separation is maintained by introducing at least one electrically insulating spacer (22) between said conductors (14) and said integrated circuit (11).

5. The process according to aim 2, wherein the separation is maintained by introducing at least one electrically insulating spacer (22) between said conductors (14) an d said integrated circuit (11).

6. The process according to claim 4, further including linking said at least one insulating spacer (22) to an insulating frame (24) attached to the conductors at an attachment point located outside the integrated circuit area.

* * * * *

UNITED STATES PATENT AND TRADEMARK OFFICE
CERTIFICATE OF CORRECTION

PATENT NO. : 6,305,074 B1  Page 1 of 1
DATED : October 23, 2001
INVENTOR(S) : Courant It is certified that error appears in the above-identified patent and that said Letters Patent is hereby corrected as shown below:

<u>Column 8, claim 5,</u>
Line 43, delete "an d" and insert -- and --

Signed and Sealed this

Second Day of April, 2002

Attest:

JAMES E. ROGAN
*Attesting Officer*   *Director of the United States Patent and Trademark Office*